United States Patent [19]

Bornside et al.

[11] Patent Number: 5,358,740
[45] Date of Patent: Oct. 25, 1994

[54] METHOD FOR LOW PRESSURE SPIN COATING AND LOW PRESSURE SPIN COATING APPARATUS

[75] Inventors: David E. Bornside, Arlington; Robert A. Brown, Winchester, both of Mass.

[73] Assignee: Massachusetts Institute of Technology, Cambridge, Mass.

[21] Appl. No.: 179,871

[22] Filed: Jan. 11, 1994

Related U.S. Application Data

[63] Continuation of Ser. No. 903,773, Jun. 24, 1992, abandoned.

[51] Int. Cl.$^5$ ................................. B05D 3/2
[52] U.S. Cl. ....................... 427/240; 118/52
[58] Field of Search ............... 118/52; 427/240

[56] References Cited

U.S. PATENT DOCUMENTS

| | | | |
|---|---|---|---|
| 3,902,857 | 9/1975 | Van der Mey et al. | 23/284 |
| 4,004,045 | 1/1977 | Stelter | 427/55 |
| 4,163,751 | 8/1979 | Van der Mey et al. | 260/457 |
| 4,385,083 | 5/1983 | Shelley | 427/240 |
| 4,551,355 | 11/1985 | Ericson et al. | 427/48 |
| 4,587,139 | 5/1986 | Hagan et al. | 427/130 |
| 4,640,846 | 2/1987 | Kuo | 427/82 |
| 4,673,996 | 6/1987 | White | 360/103 |
| 4,743,416 | 5/1988 | Sugimoto et al. | 264/40.3 |
| 4,794,021 | 12/1988 | Potter | 427/240 |
| 4,838,979 | 6/1989 | Nishida et al. | 118/52 |
| 4,889,069 | 12/1989 | Kawakami | 118/52 |
| 4,894,351 | 1/1990 | Batty | 437/190 |
| 4,935,095 | 6/1990 | Lehrer | 156/644 |
| 4,992,301 | 2/1991 | Shishiguchi et al. | 427/51 |
| 5,066,616 | 11/1991 | Gordon | 437/229 |
| 5,069,156 | 12/1991 | Suzuki | 118/52 |
| 5,070,813 | 12/1991 | Sakai et al. | 118/695 |
| 5,116,250 | 5/1992 | Sago et al. | 118/52 |

FOREIGN PATENT DOCUMENTS 3-272130 12/1991 Japan .

OTHER PUBLICATIONS

Bornside et al., "Spin coating: One-dimensional model," *Journal of Applied Physics,* 66(11):5185–5193, Dec. 1, 1989.

Bornside et al., "On the Modeling of Spin Coating," *Journal of Imaging Technology,* vol. 13, 4:122–130, Aug. 1987.

Bornside et al., "Spin Coating of a PMMA/Chlorobenzene Solution," *Journal of the Electrochemical Society,* vol. 138, 1:317–320, Jan. 1991.

Chen, "Investigation of the Solvent-Evaporation Effect on Spin Coating of Thin Films," *Polymer Engineering and Science,* vol. 23, 7:399–403, May 1983.

Clarkson et al., "Visualization of Flow Instabilities on a Rotating Disk," *AIAA Journal,* vol. 18, 1541–1543, Dec. 1980.

Crooks et al., "Generation of Radial Striations on Particulate Coated Magnetic Disks," *IEEE Transactions on Magnetics,* vol. Mag 23, 5:3146–3148, Sep. 1987.

Daughton et al., "An Investigation of the Thickness Variation of Spun-on Thin Films Commonly Associated with the Semiconductor Industry," *Journal of Electrochem. Soc.,* vol. 129, 1:173–179, Jan. 1982.

Elliot, "Photoresist Coating," Softbake, *Integrated Circuit Fabrication Technology,* Chpts 6 and 7, 125–163, 1982. (no month date).

Ellison, "Mass Transfer to a Rotating Disk," *Journal of Electrochem. Soc.,* 18:68–72, Jan. 1971.

(List continued on next page.)

*Primary Examiner*—Shrive Beck
*Assistant Examiner*—Katherine A. Bareford
*Attorney, Agent, or Firm*—Arnold, White & Durkee

[57] ABSTRACT

An apparatus and method is provided for spin coating films on a surface. The apparatus includes a chamber capable of being closed to the atmosphere, a spinnable member within the chamber capable of supporting the surface and a pump capable of reducing the pressure within the chamber. The method includes depositing a liquid on the surface, reducing the pressure in the vicinity of the surface and spinning the surface.

35 Claims, 4 Drawing Sheets

OTHER PUBLICATIONS

Emslie et al., "Flow of a Viscous Liquid on a Rotating Disk," *Journal of Applied Physics*, vol. 29, 5:858–862, May 1958.

Fedorov et al., "Transitional Flow Conditions on a Rotating Disk," *Journal of Engineering Physics*, vol. 31, 1448–1453, Dec. 1976.

Flack et al., "A Mathematical Model for Spin Coating of Polymer Resists," *Journal of Applied Physics*, vol. 56, 4:1199–1206, Aug. 15, 1984.

Kobayashi et al., "Spiral Vortices in Boundary Layer Transition Regime on a Rotating Disk," *ACTA Mechanica*, 35:71–82, 1980. (no month date).

Kohama et al., "AIAA-87-1340 Crossflow Instability in Rotating Disk Boundary-Layer," *AIAA 19th Fluid Dynamics, Plasma Dynamics and Lasers Conference*, 1–6, Jun. 8–10, 1987, Honolulu, Hawaii.

Kohama et al., "Study on Boundary Layer Transition of a Rotating Disk," *Acta Mechanica*, 50:193–199, 1984. (no month date).

Kreith et al., "Heat and Mass Transfer from a Rotating Disk," *Journal of Heat Transfer*, 81:95–105, May 1959.

Lai et al., "An Investigation of Spin Coating of Electron Resists," *Polymer Engineering and Science*, vol. 19, 15:1117–1121, Nov. 1979.

Malik et al., "Instability and Transition in Rotating Disk Flow," *AIAA Journal*, vol. 19, 9:1131–1138, Sep. 1981.

Malik et al., "The Neutral Curve for Stationary Disturbances in Rotating-Disk Flow," *J. Fluid. Mech.*, vol. 164, 275–287, 1986. (no month date).

Meyerhofer, "Characteristics of Resist Films Produced by Spinning," *Journal of Applied Physics*, vol. 49, 7:3993–3997, Jul. 1978.

Sirivat, "Stability Experiment of Flow Between a Stationary and a Rotating Disk," *Phys. Fluids A*, vol. 3, 11:2664–2671, Nov. 1991.

Smith, "Exploratory Investigation of Laminar-Boundary-Layer Oscillations on a Rotating Disk, Technical Note No. 1227, " *National Advisory Committee for Aeronautics*, 1–15, May 1947.

Sparrow et al., "Heat Transfer from a Rotating Disk to Fluids of Any Prandtl Number," *Journal of Heat Transfer*, 81:249–251, Aug. 1959.

Sparrow et al., "Mass Transfer, Flow, and Heat Transfer About a Rotating Disk," *Journal of Heat Transfer*, 82:294–302, Nov. 1960.

Stuart et al., "On the Stability of Three-Dimensional Boundary Layers with Application to the Flow Due to a Rotating Disk," *Price 17s. 6d.*, vol. 248, 20–199, Jul. 14, 1955.

Sukanek, "Spin Coating," *Journal of Imaging Technology*, vol. 11, 4:184–190, Aug. 1985.

Szeri et al., "Short Communication Stability of Flow Over a Rotating Disk," *International Journal for Numerical Methods in Fluids*, vol. 4, 989–996, 1984. (no month date).

Wilkinson et al., "Stability Experiments in the Flow over a Rotating Disk," *AIAA Journal*, vol. 23, 4:588–595, Apr. 1985.

METHOD FOR LOW PRESSURE SPIN COATING AND LOW PRESSURE SPIN COATING APPARATUS

This application is a continuation, of appliation Ser. No. 07/903,773, filed Jun. 24, 1992, now abandoned.

BACKGROUND OF THE INVENTION

This invention relates to a spin coating apparatus and method and, more particularly, to an apparatus and method for forming a substantially uniform film on a spinning surface.

Spin coating is a well known method for forming thin films on a surface. For example, spin coating is used in manufacturing semiconductor integrated circuits because one step in semiconductor photolithography processing involves coating thin photoresist films on a semiconductor wafer. Spin coating may also be used in other semiconductor manufacturing steps including forming polyimide and silicon dioxide films. Spin coating is also used for forming films in other applications including magnetic disks, lens coatings, reflectors, liquid crystal displays and screens. Spin coating is well adapted to achieve a film of fairly uniform thickness across a surface.

Figure 1:
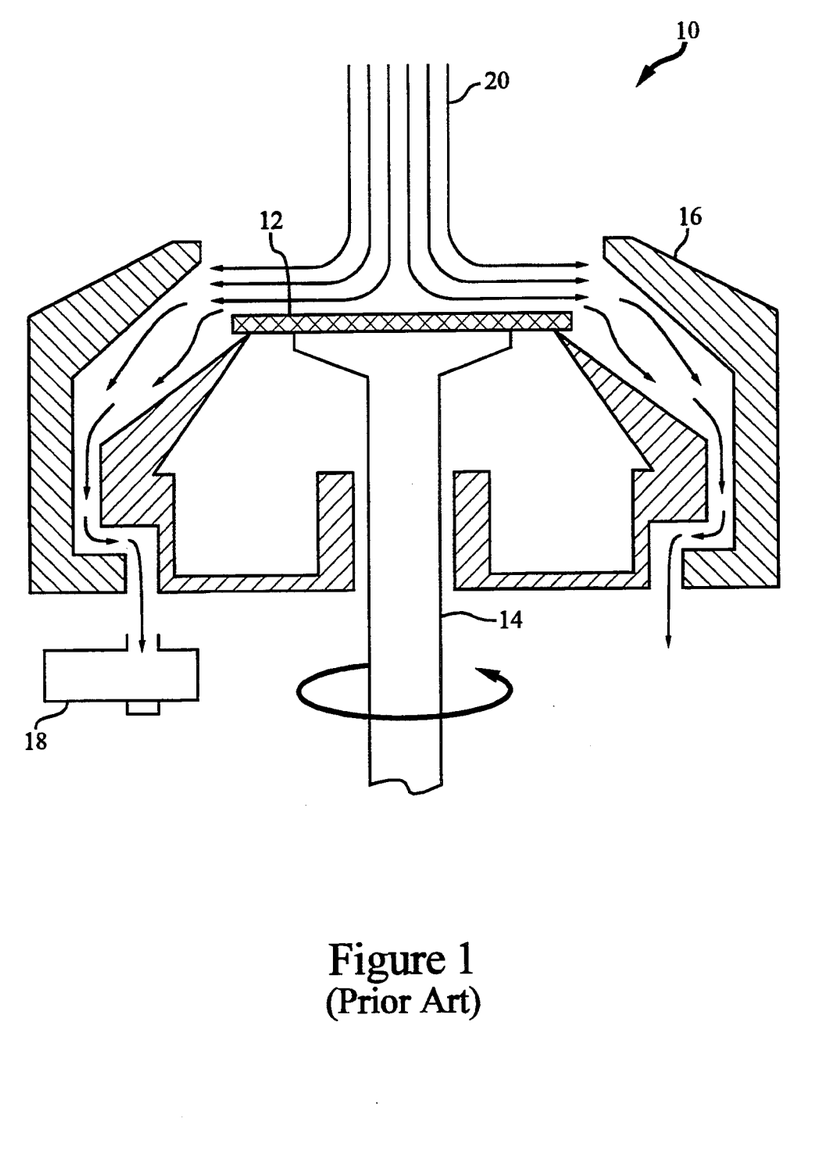
FIG. 1 is a schematic, sectional view of a prior art semiconductor photoresist spin coater.

Conventional spin coating involves depositing a liquid on a surface which is spinning about an axis. A typical spin coating apparatus and method is shown in FIG. 1. Referring to FIG. 1, a spin coater 10 is shown specifically adapted for applications in semiconductor manufacturing. Surface 12, which may be a semiconductor wafer, is placed on a spinning member 14, for example a semiconductor wafer chuck, which spins about an axis perpendicular to surface 12. Spinning member 14 is contained within a partially open chamber 16. A liquid is deposited onto the surface by a nozzle that is either stationary above the surface or that follows a predetermined path above the surface. During the liquid deposition the surface may or may not be spinning. Typically after the deposition is completed, the spin rate is rapidly increased to a final spin speed. The time duration for the spinning will vary depending on the specific desired results. After spinning, only a thin film is left on the surface. The pressure within the chamber 16 and across the surface is substantially atmospheric in view of the top opening to the chamber and the typical role of exhaust.

A spin coating liquid is often composed of a nonvolatile material (i.e., a material with a low evaporation rate) dissolved or dispersed in a volatile medium, (i.e., a material with a higher evaporation rate). After the liquid is deposited, centrifugal force causes much of the liquid to flow off the surface. Simultaneously, the volatile medium evaporates. Due to both the centrifugal force and the evaporation, the liquid is converted to a substantially nonliquid thin film comprising the nonvolatile material. The effects of both the centrifugally driven flow of the liquid and the evaporation of the volatile medium from the liquid determine the thickness profile of the final film.

Figure 2:
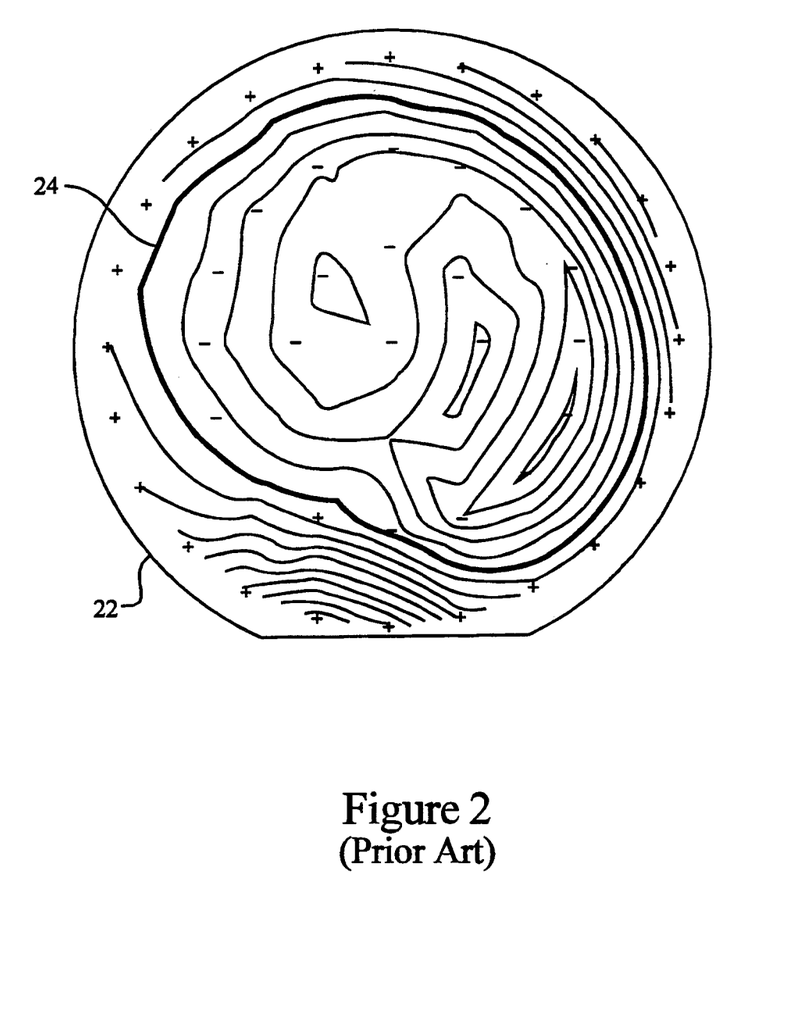
FIG. 2 is an actual film uniformity contour map produced by the spin coater of FIG. 1.

An exemplary thickness contour uniformity map obtained using a conventional spin coater 10 is shown in FIG. 2. More specifically, FIG. 2 displays the uniformity of a photoresist film on a six inch diameter semiconductor wafer 22. Liquid photoresist is applied to the surface of the wafer and, after spinning, forms the relatively dry and nonvolatile (as compared to the liquid) photoresist film used for photolithography processing. Typical liquid photoresist comprises nonvolatile materials including a polymer resin (such as novolac) and a photo active agent (such as naptho quinone diazide) dissolved or otherwise dispersed within a volatile solvent such as ethyl lactate or one-methoxy-two-propanol acetate. In this dissolved or dispersed form, a photoresist is frequently referred to as a liquid photoresist. Examples of available liquid photoresists include EL-215.5AN available from Dynachem and OCG-895.I available from OCG. The photoresist film in FIG. 2 was formed by spinning a liquid photoresist on a wafer at 2000 rpm under an exhaust flow of 100 lpm. The mean film thickness, indicated by heavy contour line 24, is approximately 16,731 angstroms and each contour interval is approximately 5 angstroms. The substantial nonuniformity of the film shown in FIG. 2 hinders the development of advanced semiconductor manufacturing technologies.

It is known that various process variables affect the centrifugal flow and the evaporation. The spinning speed, spinning time, spin acceleration, dispense quantity, and dispense technique are all known to affect the centrifugal flow and the final film thickness uniformity. In addition, the volatile medium, liquid viscosity, resist temperature and exhaust flow rate are also known to affect the evaporation rate and the final film thickness uniformity.

However, adjusting these variables does not adequately address the nonlaminar and turbulent gas flows that are created across the spinning surface. Generally speaking, nonlaminar and turbulent gas flows cause nonuniform evaporation rates across the spinning surface resulting in thickness nonuniformities across the surface. Nonlaminar and turbulent gas flows generally produce a nonuniform evaporation rate of the volatile medium. Thus, a nonuniform evaporation rate across the surface will result in a nonuniform final film thickness.

In addition to the process variables known to those skilled in the art, various apparatus modifications have been used to optimize spin coating film uniformity. For example in U.S. Pat. No. 5,070,813 to Sakai et al. the exhaust flow rate for a coating apparatus may be changed during the coating process in order allegedly to optimize the coating operation. The exhaust rate is monitored by an exhaust rate detection system. The flow rate detection system operates, in part, on the principle that a gas flow will inherently result in a slight pressure drop. The apparatus is open to the atmosphere so the exhaust flow will inherently cause a slight pressure reduction below atmospheric pressure. However, such slight pressure reductions still result in a nonlaminar and turbulent gas flow across the surface and thus the nonuniform evaporation effects caused by the gas flow above the wafer are not addressed.

U.S. Pat. No. 4,587,139 contemplates the introduction of a high kinematic viscosity gas, such as helium, to promote laminar flow near the surface of a disk substrate on which a magnetic ink is being coated in order to reduce the Reynolds number of the gas flow above the disk. While such an approach will result in the promotion of laminar flow characteristics, helium is relatively expensive and may require a gas recovery system, thus lending unnecessary expense and complexity to the coating apparatus.

In U.S. Pat. No. 4,640,856 to Kuo, the centrifugal force variations across a spinning semiconductor wafer are minimized by placing multiple semiconductor wafers on a large spinning disk. Placement of the wafers at a distance away from the spin axis of the large disk is alleged to increase the centrifugal force uniformity across an entire wafer. However, the nonuniform evaporation effects caused by the gas flow above the wafer are not addressed.

One spin coating apparatus for suppressing turbulent air flow above a spinning surface is described in U.S. Pat. No. 5,069,156 to Suzuki. In this apparatus a spinning wall surrounds the spinning surface in order to modify the air flow above the surface. The spinning wall allegedly slows the air speed relative to the spinning surface by directing the air in the same rotating direction as the surface. The modified air flow is said to reduce the aerodynamic forces of the air on the liquid and thus improve the final film thickness uniformity. However, this apparatus still results in turbulent air flow and does not address thickness nonuniformities which result from nonuniform evaporation rates caused by turbulent air flow.

As shown above, a difficulty with conventional spin coaters is their practical inability to substantially reduce or eliminate turbulent air flow patterns associated with film nonuniformity. Instead of focusing upon the elimination of turbulent gas flows, conventional coaters deal primarily with the process variables which affect the centrifugal flow and evaporation such as, e.g., spinning time, spin acceleration, dispensed liquid quantity, etc. While these process variables are important in maintaining uniformity, proper monitoring of the air flow pattern above the spinning surface is equally important.

SUMMARY OF THE INVENTION

The problems outlined above are in a large part solved by the device and methods of the present invention. That is, the apparatus and methods of the present invention cause a substantially laminar, axisymmetric and steady gas flow adjacent to a spinning surface. As such, the present invention is capable of producing a thin film of substantially uniform thickness placed across a spinning surface.

The present invention includes a method for forming a gas flow adjacent a spinning surface including spinning the surface about an axis which is substantially perpendicular to a plane the surface and maintaining a Reynolds number sufficiently low so to cause the gas flow to be substantially laminar, axisymmetric and steady adjacent to the surface by reducing the pressure in the vicinity of the surface. The invention further contemplates reducing the pressure to less than about 0.99 atmosphere, preferably less than between 0.3 and 0.01 atmosphere, and even more preferably less than between 0.2 and 0.05 atmosphere. The method also contemplates depositing a liquid on the surface which comprises a substantially non-volatile material dispersed in a substantially volatile medium. The liquid can be a liquid photoresist. The invention also contemplates a substantially uniformally thick photoresist film formed on a semiconductor wafer which has been coated in accordance with the method of the present invention.

The apparatus of the present invention which is used to form a film on a surface includes a chamber, a support member placed within the chamber and adapted to spin a surface about an axis, and a pump for reducing a pressure in the vicinity of the support member in order to maintain a Reynolds number sufficiently low to form a film of substantially uniform thickness. The chamber may be closed to the atmosphere, and may include a liquid dispenser which dispenses the liquid on the surface. The apparatus may further include at least one gas inlet which is adapted to direct gas into the chamber, and at least one gas outlet which is adapted to remove gas from the chamber. As with the method of the present invention, the liquid may comprise a substantially non-volatile material dispersed in a substantially volatile medium, such as, for example, a liquid photoresist.

The present invention therefore provides an improved device and process which provides a substantially laminar and axisymmetric gas flow adjacent to a spinning surface and which enables a film of substantially uniform thickness to be spin coated.

BRIEF DESCRIPTION OF THE DRAWINGS

So that the manner in which the herein described advantages and features of the present invention, as well as others which will become apparent, are attained and can be understood in detail, more particular description of the invention summarized above may be had by reference to the embodiment thereof which is illustrated in the appended drawings, which drawings form a part of this specification.

It is to be noted, however, that the appended drawings illustrate only exemplary embodiments of the invention and are therefore not to be considered limiting of its scope, for the invention may admit to other equally effective embodiments.

DETAILED DESCRIPTION

The final thickness profile of a spin coated film is determined by both the centrifugal force of the spinning and the solvent evaporation rate. After the liquid is deposited, centrifugal force causes much of the liquid to flow off the surface. Simultaneously, the volatile medium evaporates. Due to both the centrifugal force and the evaporation, the liquid is converted to a substantially nonliquid thin film comprising the nonvolatile material. The final film thickness profile is given by the following expression, $$h_f = (1 - x_o)\left[\left(\frac{3\eta_l^o}{2\rho_l^2\omega^2}\right)\frac{p^*M}{R_g T} k x_o\right]^{\frac{1}{3}} \quad \text{Eq. 1}$$

where the final film thickness is $h_f$, the initial mass fraction of solvent in the coating liquid is $x_o$, the initial viscosity of the coating liquid $\eta_l^o$, the density of the coating $\rho_l$, the spin speed of the wafer $\omega$, the vapor pressure of the volatile solvent $p^*$, the molecular weight of the solvent M, the ideal gas constant $R_g$, and the ambient temperature T. The mass transfer coefficient, k, for transport from the surface of the liquid film is defined by evaporation rate=$ky_i$ where $y_i$ is the fraction of solvent in the gas at the liquid/gas interface. $y_i$ is in equilibrium with the solvent mass fraction in the liquid $x_o$.

Equation 1 predicts that if the mass transfer coefficient for evaporation of a solvent from a liquid on a rotating surface is independent of radius from an axis of rotation, then it is possible to form a perfectly uniform film over the spinning surface. Furthermore, theory for flow of a fluid overlying a rotating surface predicts that this mass transfer coefficient is indeed independent of radius if the flow of gas induced by a spinning surface is laminar, axisymmetric about the rotational axis and steady, where steady means independent of time.

Figure 3:
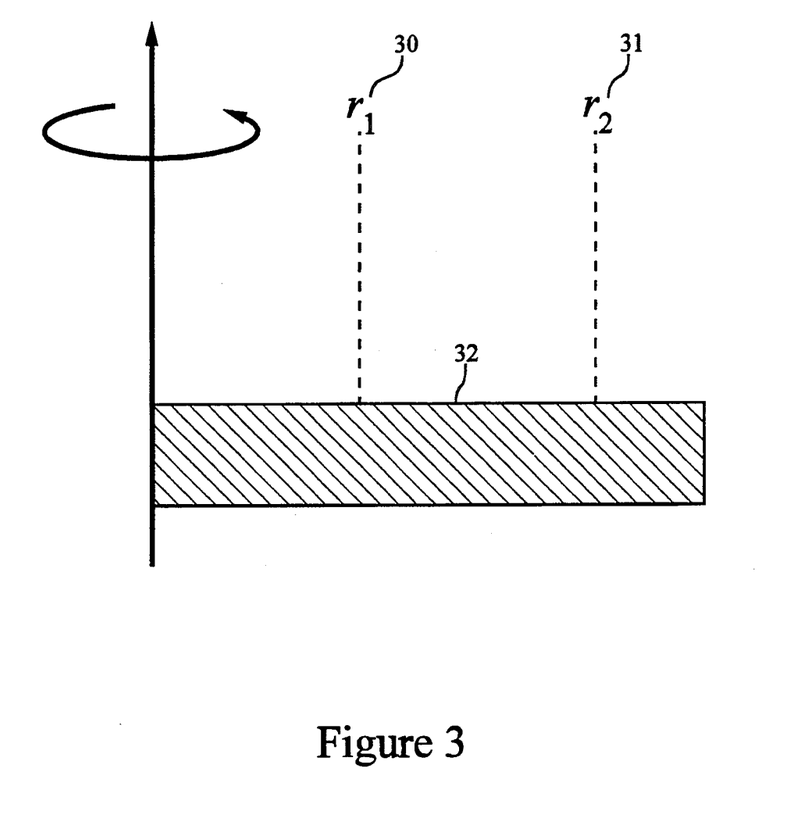
FIG. 3 is a diagrammatic view of the gas flow regimes that have been shown to be present above a spinning surface.

The nonuniform film thickness resulting from conventional spin coaters, shown in FIG. 2, is explained, in part, by a flow instability in the gas flow above the spinning surface 32. Experiments have shown that three flow regimes are present in a flow above a spinning surface 32 induced by the spinning surface 32. These states are shown in FIG. 3. For radii less than a first critical radius 30 the gas flow is laminar, axisymmetric and steady. For radii greater than a second critical radius 31 the gas flow is turbulent and the mass transfer coefficient is nearly a linear function of radius and is greater than in laminar flow. For radii between the first and second critical radius the gas flow is transient and three dimensional and the mass transfer coefficient is not uniform and in this state Ekman spirals or spiral vortices nested across the surface have been reported.

The onset of each of these flow transitions is characterized by a Reynolds number based on the local radius of the surface, as defined in Equation 2, $$R_e = \frac{r^2 \omega}{v} \qquad \text{Eq. 2}$$

where $R_e$ is the Reynolds number, r is the local radius, $\omega$ is the spin speed of the surface and v is the kinematic viscosity of the overlying gas. The first flow transition (from laminar, axisymmetric and steady flow to three-dimensional and transient flow) has been reported experimentally to occur at a Reynolds number as low as $0.6 \times 10^5$ and theoretically calculated to occur at a Reynolds number between $0.7 \times 10^5$ and $0.8 \times 10^5$.

For example, the prior art film coating shown in FIG. 2 was coated with the prior art apparatus shown in FIG. 1 at a spin speed of 2000 rpm in air at substantially atmospheric pressure and with an exhaust flow rate of 100 lpm. If the transition radius for the first flow instability, radius 30 in FIG. 3, is taken to correspond to the mean film thickness contour line 24 in FIG. 2, then the first flow transition occurs at a Reynolds number of approximately $0.5 \times 10^5$. It is possible that the added exhaust flow from exhaust 18 lowers the stability limit slightly from the predictions of experiments without this flow.

The present invention involves spin coating under a reduced pressure to eliminate the gas flow instability from occurring adjacent to the spinning surface. Thus, Equation 2 can be rewritten to show the pressure dependency of the Reynolds number. The kinetic viscosity of air, v, is related to the viscosity of air, $\mu$, and density of air, $\rho$, as shown in Equation 3.

$$v = \frac{\mu}{\rho} \qquad \text{Eq. 3}$$

Because at the pressures of interest here the viscosity of air is nearly independent of pressure and the ideal gas law can be taken as a good approximation for the dependence of density on pressure, the density and pressure are substantially related as shown in Equation 4, $$\rho = \frac{PM}{R_g T} \qquad \text{Eq. 4}$$

where P is the air pressure, M is the air molecular weight, T is the air temperature and $R_g$ is the ideal gas constant. Thus, the local Reynolds number of the gas flow will scale linearly with the pressure of the overlying gas, as shown in Equation 5.

$$R_e = \frac{r^2 \omega PM}{\mu R_g T} \qquad \text{Eq. 5}$$

It should be recognized that gasses other than air may be used and will show a similar pressure and flow instability dependency.

Thus, in accordance with the present invention, reducing the gas pressure adjacent to a spinning surface will reduce the Reynolds number at any particular point away from the spin axis. For example, for an eight inch diameter semiconductor wafer spun at 4000 rpm in air, the local Reynolds number at the periphery of the wafer would be $2.7 \times 10^5$ at atmospheric pressure and $0.27 \times 10^5$ at 0.1 atmospheres pressure. The first value is substantially above the stability limit of the first flow transition and the latter value is below the stability limit.

As another example, for a six inch diameter semiconductor wafer spun at 4000 rpm in air, the local Reynolds number at the periphery of the wafer would be $1.5 \times 10^5$ at atmospheric pressure and $0.15 \times 10^5$ at 0.1 atmospheres. Once again, the first value is substantially above the stability limit of the first flow transition and the latter value is significantly below the stability limit.

The theory and examples discussed above involve the gas flows induced by the spinning surface itself. It is possible that adding an external exhaust flow over the wafers lowers the stability limit slightly from the predictions of experiments without this flow. Thus, the pressures needed to move the first flow transition to the periphery of a wafer may be slightly lower than predicted in Equation 5 when an external exhaust flow is used.

It should be noted that the above theory was based on the gas flow created over a substantially circular spinning surface. However, the principle of reducing the pressure to reduce gas flow disturbances and to decrease nonuniformities in the mass transfer coefficient may also be applied to more complicated gas flows over noncircular surfaces. Thus, the present invention may also be used for spin coating substantially noncircular surfaces.

The present invention in a general embodiment comprises a system of reducing the gas flow instability above a spinning surface. By reducing the local Reynolds number of the gas flow Re at every point on the wafer below its critical value for the onset of the transition to transient and three-dimensional flow, a substantially laminar, axisymmetric and steady gas flow is maintained. The region of substantially laminar, axisymmetric and steady gas flow extends across larger and larger surfaces as the pressure is further decreased. The substantially laminar, axisymmetric and steady gas flow will lead to a mass transfer coefficient which is substantially independent of radius and, thus, a substantially uniform evaporation rate and a substantially uniformly thick film form across the surface.

Figure 4:
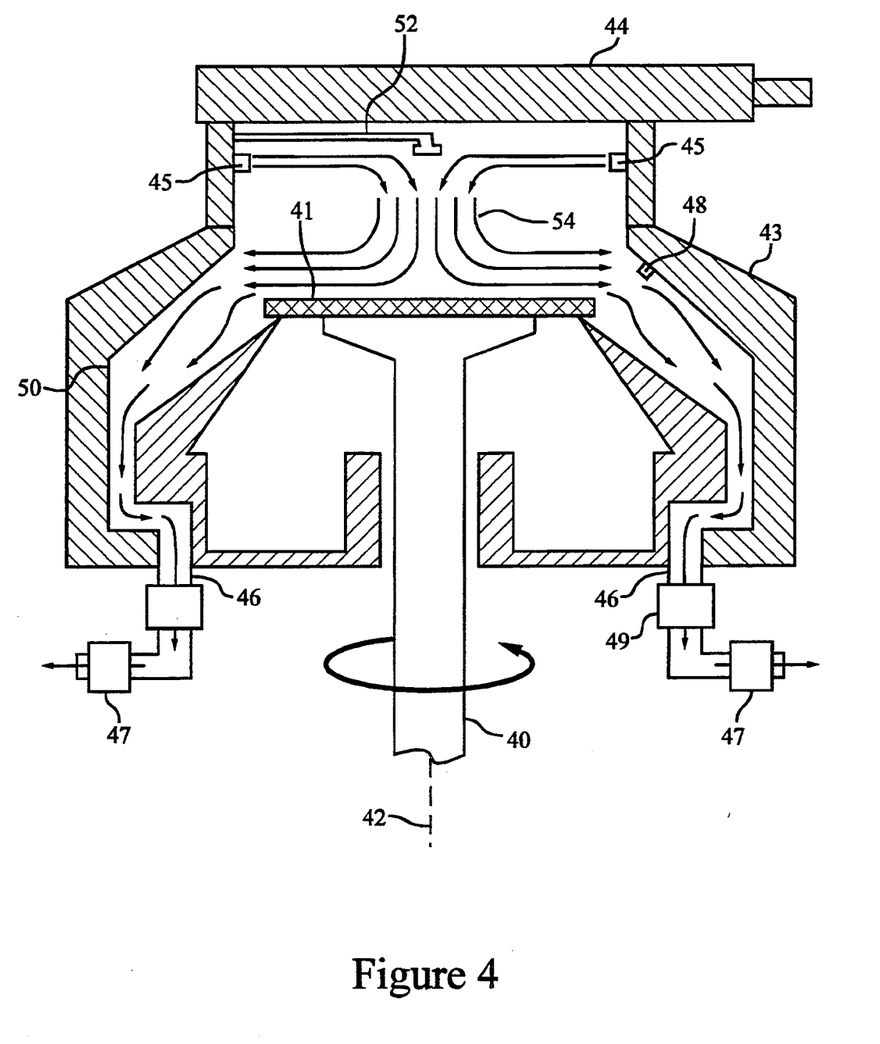
FIG. 4 is a spin coater according to the present invention.

In one embodiment, the invention comprises a system, as shown in FIG. 4, for forming a thin, uniformly thick film on a surface member by spin coating. The invention, more particularly, comprises a spinnable support member 40 which is capable of supporting a flat, laterally disposed specimen or other surface 41, and which is capable of spinning about an axis 42 substantially perpendicular to a plane of the surface. The support member is mounted within a sealable chamber 43. Chamber 43 may have at least one gate valve 44 or other closable mechanism through which the surface may pass. Chamber 43 is designed to create a gas flow pattern 54 such that gas flows in a generally axisymmetrical pattern outward from spin axis 42 across surface 41. Chamber 43 has a gas flow system comprising spinning surface 41, chamber sidewalls 50, one or more gas inlets 45, and one or more gas outlets 46. Gas inlets 45 and gas outlets 46 are positioned such that gas entering the chamber flows outward across surface 41 and then exits through the outlets.

Pressure within the chamber is reduced by a vacuum pump 47, blower or the like which is connected to outlets 46, and which is capable of reducing the pressure within the chamber to a value less than atmospheric pressure. It is recognized that even an exhaust flow of gas in an unsealed chamber over a surface as generated by the exhaust 18 in the prior art apparatus shown in FIG. 1 will inherently cause a slight pressure reduction below atmospheric pressure. However, modeling shows that the prior art pressure in the vicinity of the surface is greater than 0.99 atmosphere for conventional exhaust flows of 100–800 lpm. The pressure reductions desired by the present invention, however, are greater than this slight effect. Thus, for air it is desired that the pressure within the chamber be less than about 0.5 atmosphere and preferably less than about 0.2 atmosphere. Pressures within the range between about 0.01 and 0.3 atmosphere are generally contemplated, and especially between about 0.05 and 0.2 atmosphere. The pressure within chamber 43 may by monitored and controlled by a pressure sensor 48 that is connected to a pressure control valve 49.

It is desired that, across surface 41, gas flow 54 is nonturbulent and preferably substantially laminar, axisymmetric and steady. As noted earlier, turbulent flow results in a nonuniform coating thickness. Using a pressure less than 0.99 atmosphere increases the laminar, axisymmetric and steady nature of the gas flow.

The present invention has a particular application in the formation of a photoresist film on surface 41, surface 41 more specifically being a semiconductor wafer or other substrate. Semiconductor wafers are typically substantially circular, thin wafers made of silicon, gallium arsenide or the like. The wafers are normally placed one at time on spinnable support member 40, wherein support member 40 is a spinnable wafer chuck. Wafer chuck 40 is mounted within chamber 43, wherein chamber 43 is a coating bowl. The wafer chuck typically has a wafer holder means, such as a vacuum means, which holds the wafer to the chuck while the chuck is spinning.

As used for forming a photoresist film, a coating bowl utilizing the present invention is especially characterized by at least one gate valve 44, or other valved or otherwise sealable opening, through which a wafer may be placed on and retrieved from chuck 40. Also, an apparatus using the present invention may be characterized by at least one air inlet 45 and preferably a series of inlets placed axisymmetrically around the chamber. Exhaust air is withdrawn from one or more air outlets 46 at the bottom of the coating bowl by means of vacuum pump 47, a blower or the like which exhausts the bowl. The air flows from inlet 45 over the wafer to the edge of the wafer and finally down to air outlets 46. The pump 47 should be capable of reducing the pressure within the coating bowl to less than one atmosphere. Pressures ranges within 0.01 to 0.3 atmosphere are contemplated. In general, the pressure should be low enough to result in non-turbulent flow, and preferably laminar flow, across the wafer.

Liquid dispenser 52, for example a nozzle or the like, may be used to dispense liquid photoresist on the wafer. This may be done by discharging the liquid photoresist in a variety of ways. For example, the nozzle may stay stationary, follow a predetermined pattern across the wafer, emit a multiple stream spray, or emit a single stream. The present invention is not dependent on any specific nozzle means.

As recognized in the prior art, a wafer is preferably spinning when the liquid photoresist is dispensed on the wafer so as to help uniformly spread the photoresist on the wafer. Typically, with prior art, a wafer is spinning at a rate of hundreds of revolutions per minute during the photoresist dispense. Alternatively, a wafer may be stationary during the dispense. Also under prior art, a wafer is generally accelerated to a final spin speed between 1000 and 5000 rpm after the dispense is completed.

Under the present invention, the spinning parameters may be optimized by methods known in the art. The parameters should be controlled such that the spinning causes the liquid photoresist to flow in a thin film outward across the wafer and, concomitantly, causes the volatile solvent in the liquid photoresist to evaporate and leave on the wafer the relatively dry polymeric photoresist film. Preferably, the pressure in chamber 43 is reduced before the liquid photoresist is dispensed; however, the invention is not limited to reducing the pressure first. Specific operating conditions for any given coating apparatus using this invention may be expected to vary somewhat, depending on the size and geometry of the apparatus. It is important, however, that the Reynolds number is below the stability limit to ensure that air or gas flow across the spinning wafer or substrate is substantially laminar, axisymmetric and steady.

Further modifications and alternative embodiments of this invention will be apparent to those skilled in the art in view of this description. Accordingly, this description is to be construed as illustrative only and is for the purpose of teaching those skilled in the art the manner of carrying out the invention. It is understood that the forms of the invention herein shown and described are to be taken as the presently contemplated embodiments. For example, equivalent elements, materials or methods may be substituted for those illustrated and described herein, and certain features or methods of the invention may be utilized independently of the use of other features or methods, all as would be apparent to one skilled in the art after having the benefit of this description of the invention.

What is claimed:

1. A method of forming a gas flow adjacent a spinning surface, comprising:
    providing a film upon the surface, said surface being within a chamber;
    spinning the surface about an axis substantially perpendicular to a plane of the surface; and
    maintaining a Reynolds number sufficiently low to cause the gas to flow substantially laminar, axisymmetric and steady adjacent the film by reducing a pressure adjacent substantially the entire film; and
    injecting said gas into said chamber through at least one gas inlet during said maintaining step.

2. The method of claim 1, wherein the Reynolds number is maintained sufficiently low by reducing the pressure in adjacent substantially the entire film to a pressure less than about 0.99 atmosphere.

3. The method of claim 2, wherein the providing step comprises depositing a liquid on the surface.

4. The method of claim 3, wherein the surface is spinning during said depositing step.

5. The method of claim 3, wherein said depositing step occurs before said spinning step.

6. The method of claim 3, wherein the liquid comprises a substantially nonvolatile material dispersed in a substantially volatile medium.

7. The method of claim 6, wherein the liquid comprises a liquid photoresist.

8. The method of claim 2, wherein the pressure is reduced to between about 0.3 and 0.01 atmosphere.

9. The method of claim 8, wherein the providing step comprises depositing a liquid on the surface.

10. The method of claim 2, wherein the pressure is reduced to between about 0.2 and 0.05 atmosphere.

11. The method of claim 10, wherein the providing step comprises depositing a liquid on the surface.

12. A method of forming a film on a surface, comprising:
    depositing a liquid on the surface;
    spinning the surface, about an axis substantially perpendicular to a plane of the surface;
    maintaining a Reynolds number within a chamber sufficiently low by reducing a pressure adjacent substantially the entire surface to form a film of substantially uniform thickness;
    injecting a gas into said chamber through at least one gas inlet during said maintaining step; and withdrawing said gas from said chamber through at least one gas outlet during said maintaining step, said at least one gas inlet and at least one gas outlet disposed to create a substantially laminar, axisymmetric gas flow adjacent the surface.

13. The method of claim 12, wherein the Reynolds number is maintained sufficiently low by reducing a pressure adjacent substantially the entire surface to a pressure between about 0.3 and 0.01 atmosphere.

14. The method of claim 13, wherein the surface is spinning during said depositing step.

15. The method of claim 13, wherein said depositing step occurs before said spinning step.

16. The method of claim 13, wherein the liquid comprises a substantially nonvolatile material dispersed in a substantially volatile medium.

17. The method of claim 16, wherein the liquid comprises a liquid photoresist.

18. The method of claim 13, wherein the pressure is reduced to between about 0.2 and 0.05 atmosphere.

19. The method of claim 18, further comprising depositing a liquid on the surface.

20. The method of claim 13, wherein said film is substantially nonliquid.

21. A method of forming a substantially laminar, axisymmetric and steady gas flow adjacent a spinning surface, comprising:
    provided a chamber substantially closed to the atmosphere;
    spinning the surface within the chamber and about an axis substantially perpendicular to a plane of the surface;
    reducing a pressure adjacent substantially all of the surface to a pressure less than about 0.5 atmosphere;
    injecting said gas into said chamber through a plurality of gas inlets during said reducing step; and
    withdrawing said gas from said chamber through at least one gas outlet during said reducing step, said plurality of gas inlets and at least one gas outlet disposed to create a substantially laminar, axisymmetric gas flow adjacent the surface.

22. A method of forming a substantially uniformly thick film on a surface, comprising:
    providing a chamber substantially closed to the atmosphere;
    depositing a liquid on the surface;
    spinning the surface within the chamber and about an axis substantially perpendicular to a plane of the surface;
    reducing a pressure adjacent substantially all of the surface to a pressure less than about 0.99 atmosphere;
    injecting a gas into said chamber through a plurality of gas inlets during said reducing step; and
    withdrawing said gas from said chamber through at least one gas outlet during said reducing step, said plurality of gas inlets and at least one gas outlet disposed to create a substantially laminar, axisymmetric gas flow adjacent the surface during said reducing step.

23. The method of claim 22, wherein the pressure is reduced to between about 0.3 and 0.01 atmosphere.

24. The method of claim 22, wherein the pressure is reduced to between about 0.2 and 0.05 atmosphere.

25. An apparatus for forming a film on a surface, comprising:
    a chamber sufficiently closed to the atmosphere to maintain a Reynolds number adjacent substantially the entire film sufficiently low to form a film of substantially uniform thickness;
    a support member placed within the chamber and adapted to spin a surface about an axis;
    a pump for reducing a pressure within substantially the entire chamber;
    at least one gas inlet for directing a gas into the chamber while said Reynolds number is maintained sufficiently low; and
    at least one gas outlet for removing said gas from the chamber.

26. The apparatus of claim 25, further comprising a liquid dispenser adapted to dispense a liquid on the surface.

27. The apparatus of claim 26, wherein said at least one gas inlet includes a plurality of gas inlets placed symmetrically about said axis to form a substantially laminar, axisymmetric gas flow above said surface.

28. The apparatus of claim 27, wherein the liquid comprises a substantially nonvolatile material dispersed in a substantially volatile medium.

29. The apparatus of claim 28, wherein the liquid comprises a liquid photoresist.

30. The apparatus of claim 27, wherein the surface comprises a semiconductor wafer.

31. The apparatus of claim 27, further comprising a gate valve through which the surface may be passed.

32. The apparatus of claim 25, wherein the pump can reduce the pressure within substantially the entire chamber to less than about 0.5 atmosphere.

33. An apparatus for forming a substantially uniformly thick film on a surface, comprising:

a chamber sufficiently closed to the atmosphere to maintain a pressure less than one atmosphere;

a support member placed within the chamber and adapted to spin a surface about an axis;

a pump for reducing the pressure adjacent substantially the entire surface;

a plurality of gas inlets adapted for directing a gas into the chamber; and at least one gas outlet adapted for removing said gas from the chamber, said plurality of gas inlets and at least one gas outlet disposed to create a substantially laminar, axisymmetric gas flow adjacent the surface when said pressure is reduced.

34. The apparatus of claim 33, wherein the pump can reduce the pressure within substantially the entire chamber to less than about 0.5 atmosphere.

35. The apparatus of claim 33, wherein the pump can reduce the pressure within substantially the entire chamber to less than about 0.2 atmosphere.

* * * * *